United States Patent [19]

Hashimoto

[11] Patent Number: 5,172,249
[45] Date of Patent: Dec. 15, 1992

[54] PHOTOELECTRIC CONVERTING APPARATUS WITH IMPROVED SWITCHING TO REDUCE SENSOR NOISES

[75] Inventor: Seiji Hashimoto, Yokohama, Japan
[73] Assignee: Canon Kabushiki Kaisha, Tokyo, Japan
[21] Appl. No.: 530,801
[22] Filed: May 30, 1990
[30] Foreign Application Priority Data

May 31, 1989 [JP] Japan .................................. 1-136125
Oct. 20, 1989 [JP] Japan .................................. 1-271781
Nov. 22, 1989 [JP] Japan .................................. 1-301819

[51] Int. Cl.$^5$ ............................................. H04N 3/14
[52] U.S. Cl. .................................................... 358/482
[58] Field of Search ...................... 358/213.15–213.18, 358/482, 483

[56] References Cited

U.S. PATENT DOCUMENTS

| 4,589,028 | 5/1986 | Ochi ................................... 358/213.27 |
| 4,809,074 | 2/1989 | Imaide et al. .................. 358/213.15 |
| 4,839,729 | 6/1989 | Ando et al. ...................... 358/223.15 |
| 4,843,473 | 6/1989 | Bencuya et al. ................ 358/213.15 |

Primary Examiner—Stephen Brinich
Attorney, Agent, or Firm—Fitzpatrick, Cella, Harper & Scinto

[57] ABSTRACT

There is provided a photoelectric converting apparatus comprising: an accumulating unit to accumulate charges which were light excited; an amplifying unit to amplify charges of a control electrode; a switching device to connect the accumulating unit and the control electrode; a first reading unit to read out an output of the amplifying unit as a first signal when the switching device is set into a nonconductive state; a transferring unit to make the switching device conductive and to transfer the charges in the accumulating unit to the control electrode; a second reading unit to read out the output of the amplifying unit as a second signal after the charges were transferred; and a subtraction processing circuit to execute a subtracting process between the first and second signals.

17 Claims, 11 Drawing Sheets

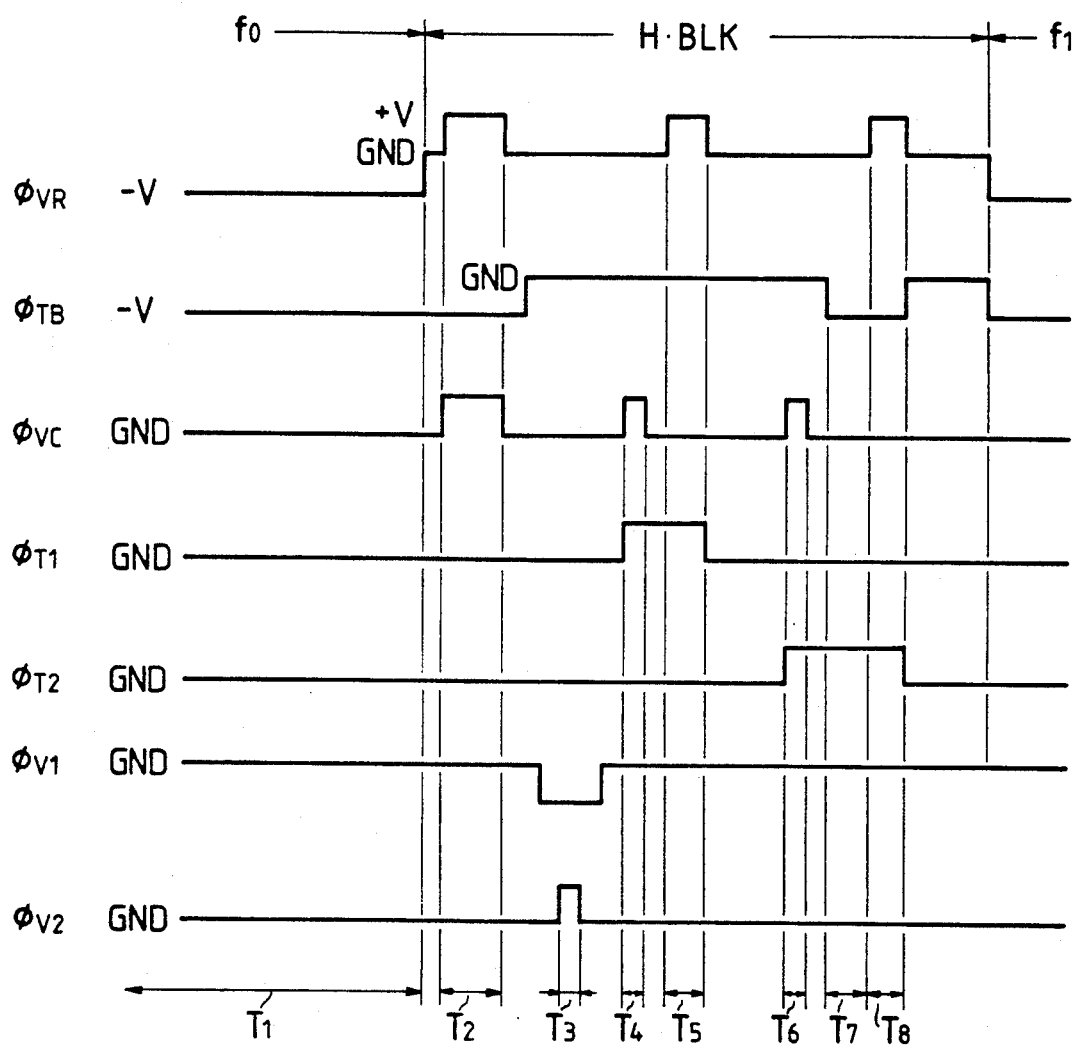

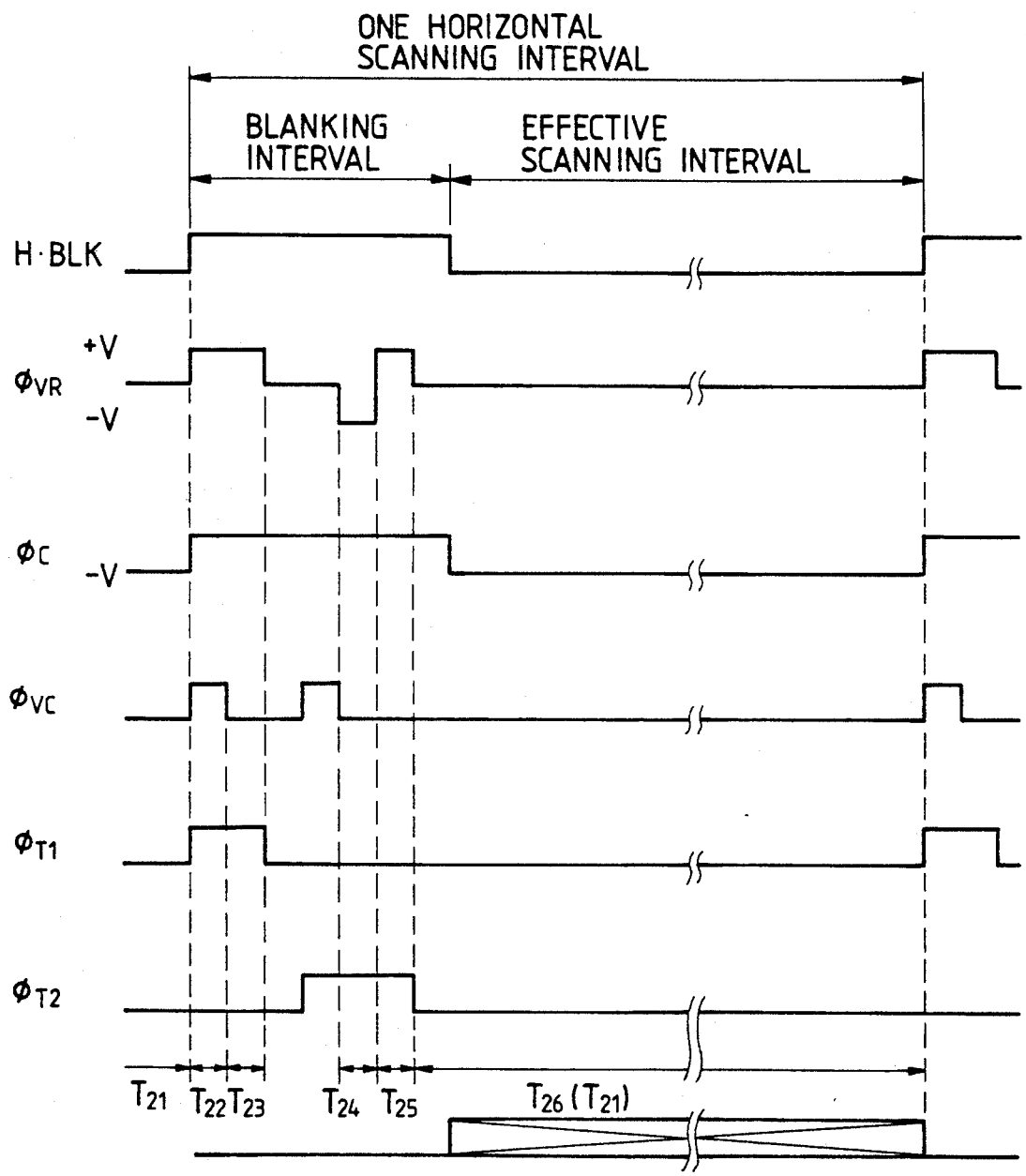

PHOTOELECTRIC CONVERTING APPARATUS WITH IMPROVED SWITCHING TO REDUCE SENSOR NOISES

BACKGROUND OF THE INVENTION

1. Field of the Invention

The present invention relates to a photoelectric converting apparatus which intends to reduce sensor noises.

2. Description of the Related Background Art

As a sensor which is used in a solid state image pickup device or the like, an amplifying type sensor is preferably used to increase an output signal level and the like.

The amplifying type sensor is constructed by a transistor of the MOS type, SIT type, FET type, bipolar type, etc. and charge amplifies or current amplifies the charges accumulated in their control electrodes and outputs from a main electrode. For instance, an example of the amplifying type sensor has been disclosed in Japanese Patent Publication Gazette No. 55-28456. As one of the problems of such amplifying type sensors, a point that the sensor noises are large can be mentioned.

The sensor noises are generally mainly classified into fixed pattern noises (hereinafter, referred to as FPN) which fixedly appear and random noises which are fetched to the control electrode when the control electrode is reset.

Among the sensor noises, since the FPN fixedly appear, they can be completely eliminated by subtracting a dark-state output of the sensor from the photo signal output of the sensor. The dark-state output can be obtained by reading out the output immediately after the accumulation time was set to almost zero, that is, after the sensor was reset.

On the other hand, in order to also eliminate the random noises which were fetched to the control electrode, it is sufficient to subtract the sensor output (photo signal) after completion of the accumulation from the sensor output (sensor noises) just after the start of the accumulation. As such a photoelectric converting apparatus which can execute the subtracting process, there is an apparatus disclosed in Japanese patent application No. 63-47492 which has already been filed by the applicant of the present invention. The above photoelectric converting apparatus has means for storing a photo signal and storage means for storing sensor noises, wherein a difference between the photo signal and the sensor noises which were stored in both of the storage means is obtained.

Although such a photoelectric converting apparatus is very practical when it is used for a line sensor, in the case where it is used for an area sensor, a chip area of the storage means for storing the sensor noises increases. Even if the storage means is provided in the outside of an image pickup device, a field memory or a frame memory is necessary and there is a problem on costs, so that it is difficult to put such an apparatus into practical use.

On the other hand, there is an apparatus in which a photoelectric converting region is laminated to the upper portion of an amplifying transistor in order to increase the sensitivity of the sensor and to relatively reduce an influence by the sensor noises. As such a solid state image pickup apparatus, there is an apparatus disclosed in Japanese patent application No. 1-9089 which has already been filed by the applicant of the present invention.

According to the above solid state image pickup apparatus, if a photoconductive film is laminated, a numerical aperture of the photoelectric converting region is extremely large, so that a sensor output (S) also similarly increases. However, to realize a further higher S/N ratio, it is necessary to reduce sensor noises (N).

SUMMARY OF THE INVENTION

It is an object of the invention to provide a photoelectric converting apparatus suitable to eliminate sensor noises in consideration of the problems in the conventional techniques as mentioned above.

According to an embodiment of the present invention, there is provided a photoelectric converting apparatus comprising: accumulating means for accumulating charges which were light excited; amplifying means for amplifying charges of a control electrode; switching means for connecting the accumulating means and the control electrode; first reading means for reading an output of the amplifying means as a first signal when the switching means is in the nonconductive state; transferring means for making the switching device conductive and for transferring the charges in the accumulating means to the control electrode; second reading means for reading out the output of the amplifying means as a second signal after the charges were transferred; and subtracting processing means for executing a subtracting process between the first and second signals.

In the photoelectric converting apparatus of the embodiment of the invention as mentioned above, by providing the switching means between the accumulating means for accumulating the light excited charges and the amplifying means for amplifying the charges of the control electrode, the sensor noises can be independently read out irrespective of the operation of the accumulating means. Not only the FPN but also the dark current component of the amplifying device and the random noises can be eliminated.

On the other hand, according to another embodiment of the invention, there is provided a photoelectric converting apparatus comprising: accumulating means for accumulating charges which were light excited; amplifying means for amplifying charges of a control electrode; resetting means which has a transfer device to connect the accumulating means and the control electrode and resets the control electrode before the charges of the accumulating means are transferred to the amplifying means, first reading means for reading out an output of the amplifying means as a first signal after the control electrode was reset; transferring means for making the transfer device conductive and for transferring the charges in the accumulating means to the control electrode; second reading means for reading out the output of the amplifying means as a second signal after the charges were transferred; and subtracting processing means for executing a subtracting process between the first and second signals.

This embodiment intends to improve the characteristics of the photoelectric converting apparatus of the above described embodiment. In the second embodiment, there is provided the resetting means for resetting the control electrode of the amplifying means before the charges of the accumulating means are transferred to the amplifying means, the output of the amplifying means is read out as a first signal after the control electrode was reset, and after the switching device was made conductive and the charges in the accumulating means were transferred to the control electrode, the output of the amplifying means is read out as a second signal. Due to this, the dark current component of the amplifying means is eliminated before the photo charges are transferred and the potential of the control electrode of the amplifying means is set to be lower than the accumulation potential of the accumulating means. Thus, the photo charges can be completely transferred from the accumulating means to the amplifying means.

If an accumulating region serving as accumulating means and an emplifying region serving as amplifying means are formed on a substrate and a photoelectric converting region is laminated onto the amplifying region and the photoelectric converting region and the amplifying region are connected, the numerical aperture can be enlarged and the S/N ratio can be increased.

According to the Invention, there is also provided a photoelectric converting apparatus having a plurality of pixels in each of which accumulating means for accumulating light excited charges, amplifying means for amplifying charges of a control electrode, and a transferring device to connect the accumulating means and the control electrode are used as component elements, wherein the apparatus comprises: resetting means which is provided between the control electrodes of the pixels which are adjacent in the sub-scanning direction; first reading means for resetting the control electrodes by the resetting means and for reading out an output of the amplifying means as a first signal; transferring means for making the transferring devices conductive and for transferring the charges of the accumulating means to the control electrode; second reading means for reading out the output of the amplifying means as a second signal after the charges were transferred; and subtracting processing means for executing a subtracting process between the first and second signals.

Therefore, according to the above embodiment, further, the resetting means for resetting the control electrodes of the amplifying means before the charges in the accumulating means are transferred to the amplifying means is provided, the output of the amplifying means is read out as a first signal after the control electrodes were reset, and the output of the amplifying means is read out as a second signal after the transferring devices were made conductive and the charges in the accumulating means were transferred to the control electrodes. Therefore, the dark current component of the amplifying means is eliminated before the photo charges are transferred and the potential of the control electrode of the amplifying means is set to be lower than the accumulation potential of the accumulating means. Therefore, the photo charges can be completely transferred from the accumulating means to the amplifying means.

On the other hand, according to the embodiment of the invention, the resetting means is provided between the control electrodes of the pixels which are adjacent in the sub-scanning direction and the control electrodes are reset by the resetting means. Therefore, the pixels arranged in the sub-scanning direction can be reset simultaneously with the resetting operation in the main scanning direction and the operation to reduce the smear is obtained. In the specification, the term "smear" denotes a phenomenon in which when the signal corresponding to the accumulated charges is read out, the potentials of the control electrodes of the amplifying means which are not selected rise and outputs appear from those amplifying means due to the excessively strong light irradiation or the like.

The reason why the smear can be reduced by the embodiment is because since the control electrodes of the amplifying means which are not selected can be also reset together with the control electrode of the amplifying means which was selected before the signal corresponding to the accumulated charges is read out of the selected amplifying means, no output appears from the amplifying means which are not selected.

The above and other objects and features of the present invention will become apparent from the following detailed description and the appended claims with reference to the accompanying drawings.

BRIEF DESCRIPTION OF THE DRAWINGS

FIG. 5 is a timing chart for the photoelectric converting apparatus;

FIG. 15 is a timing chart for explaining the operation of the photoelectric converting apparatus.

DETAILED DESCRIPTION OF THE PREFERRED EMBODIMENTS

An embodiment of the present invention will be described in detail hereinbelow with reference to the drawings.

Figure 1:
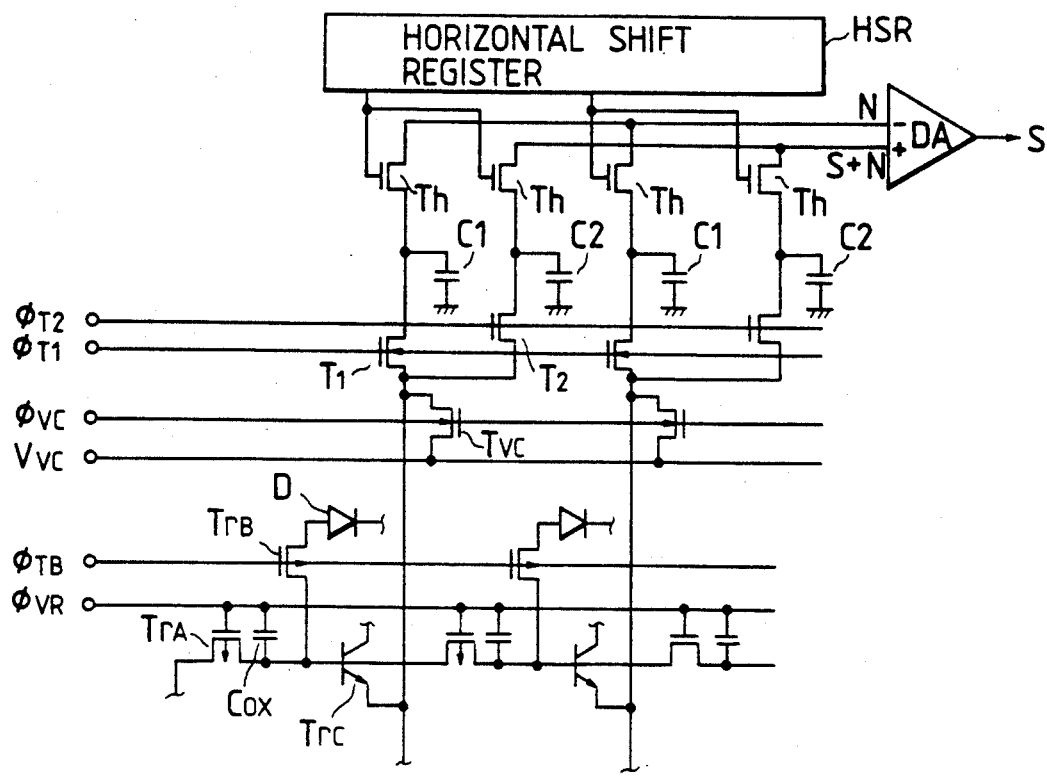
FIG. 1 is a partial circuit diagram of a first embodiment of a photoelectric converting apparatus of the invention.

FIG. 1 is a partial circuit diagram of the first embodiment of a photoelectric converting apparatus of the invention.

Figure 2:
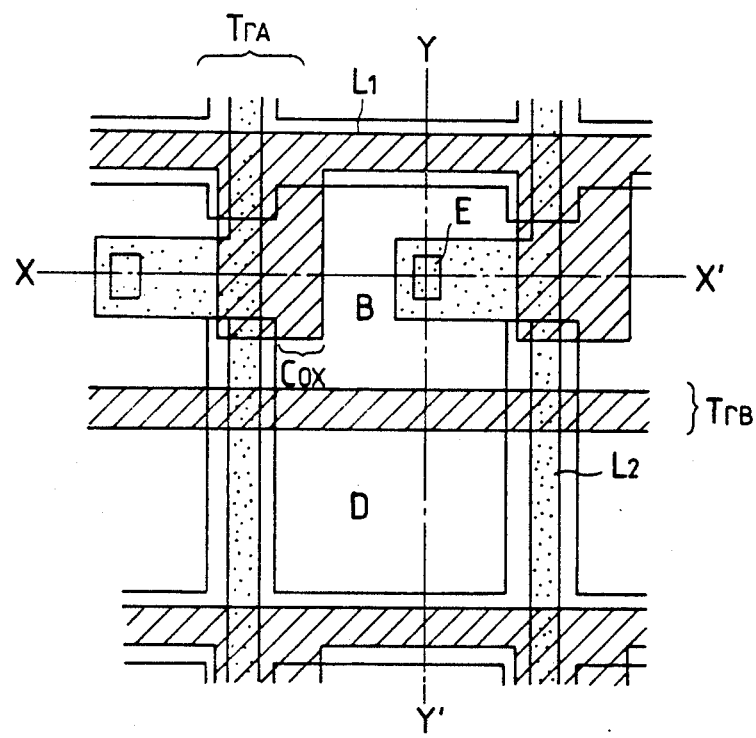
FIG. 2 is a schematic plan view of pixels of the photoelectric converting apparatus.

FIG. 2 is a schematic plan view of pixels of the photoelectric converting apparatus.

Figure 3:
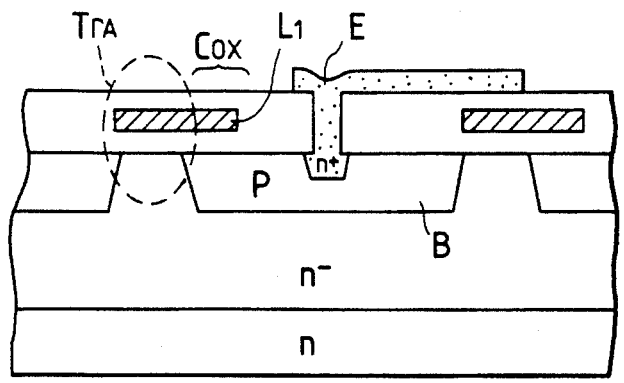
FIG. 3 is a cross sectional view taken along the line X—X' of the photoelectric converting apparatus of FIG. 2.
Figure 4A:
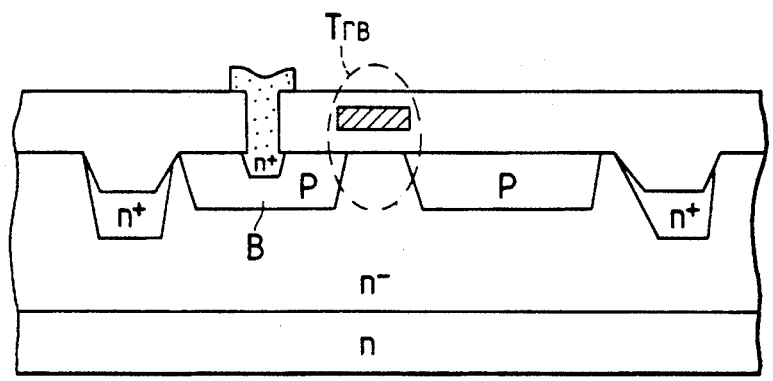
FIGS. 4A and 4B are cross sectional views taken along the line Y—Y' of the photoelectric converting apparatus of FIG. 2.
Figure 4B:
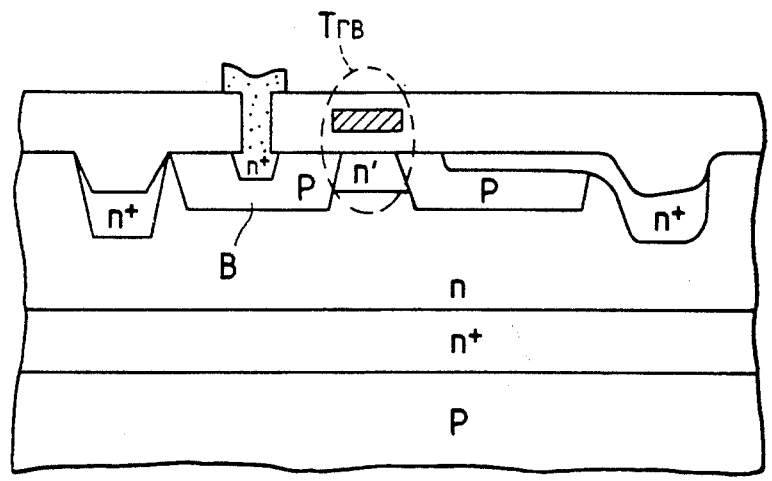

FIG. 3 is a cross sectional view taken along the line X—X' of the photoelectric converting apparatus of FIG. 2;

FIGS. 4A and 4B are cross sectional views taken along the line Y—Y' of the photoelectric converting apparatus of FIG. 2.

As shown in FIG. 1, one pixel comprises: a PMOS transistor $Tr_A$ to reset the pixel; a capacitor $C_{OX}$ to control the transient resetting operation of the pixel and the accumulating and reading operations of a signal; a photodiode D serving as accumulating means for accumulating charges which were light excited; an amplifying transistor $Tr_C$ to amplify a signal from the photodiode D; and a PMOS transistor $Tr_B$ serving as a switching device to transfer the charges which were generated in a photoelectric converting unit of the photodiode D to a base serving as a control electrode of the amplifying transistor $Tr_C$. $\phi_{VR}$ and $\phi_{TB}$ denote pulses to control the PMOS transistors $Tr_A$ and $Tr_B$, respectively.

An emitter of the amplifying transistor $Tr_C$ is connected to accumulation capacities C1 and C2 through MOS transistors $T_1$ and $T_2$. $\phi_{T1}$ and $\phi_{T2}$ denote pulses to control the MOS transistors $T_1$ and $T_2$, respectively. $T_{VC}$ denotes an MOS transistor to reset a vertical signal line. A potential of the MOS transistor $T_{VC}$ is set to a potential $V_{VC}$ by the control of a pulse $\phi_{VC}$.

As shown in FIGS. 2 and 3, the pixels are isolated by the PMOS transistors $Tr_A$ (shown by a broken line in FIG. 3). The capacitor $C_{OX}$ is formed in a part of a base B of the amplifying transistor $Tr_C$ by a poly layer $L_1$ provided on an $SiO_2$ layer. An emitter E is wired and connected as a vertical output line over the pixel isolation region by an Al layer $L_2$. As shown in FIGS. 2, 4A and 4B, the photodiode D serving as a photoelectric converting unit and the base B of the amplifying transistor $Tr_C$ are isolated by the switching device comprising the PMOS transistor $Tr_B$ (shown by broken lines in FIGS. 4A and 4B). Although the portions other than the photodiode D are generally light shielded, a light shielding layer is omitted in FIGS. 2 to 4B. n' denotes a channel doping region.

The operation of the photoelectric converting apparatus will now be described hereinbelow with reference to FIGS. 1 to 4B.

FIG. 5 is a timing chart for explaining the operation of the photoelectric converting apparatus.

In FIG. 5, first, $T_1$ denotes a resetting interval ($f_0$) of a pixel train in the horizontal direction. The pulses $\phi_{VR}$ and $\phi_{TB}$ are set to a negative potential ($-V$) and the PMOS transistor $Tr_A$ and the switching device $Tr_B$ are set to the ON state, and the horizontal pixel train after completion of the reading operation of the charges are reset.

$T_2$ indicates a transient resetting interval of a pixel train in the horizontal direction. When the pulse $\phi_{VR}$ is set to a positive potential ($+V$), the PMOS transistor $Tr_A$ is turned off and the potential of the base of the amplifying transistor $Tr_C$ and the potential of the photodiode D decrease through the capacitor $C_{OX}$. At the same time, the pulse $\phi_{VC}$ is set to the high level and the MOS transistor $T_{VC}$ is turned on, thereby setting the emitter of the amplifying transistor $Tr_C$ to a predetermined potential $V_{VC}$. At this time, the residual charges in the photodiode D and the base of the amplifying transistor $Tr_C$ are eliminated by the recombination with an emitter current (such a state is called a transient reset). After that, when the pulse $T_{VC}$ is set to the low level and the MOS transistor $T_{VC}$ is turned off and the pulse $\phi_{VR}$ is set from the positive potential to the earth potential (GND), the potential of the base of the amplifying transistor $Tr_C$ and the potential of the photodiode D also decrease through the capacitor $C_{OX}$. Further, when the pulse $\phi_{TB}$ is set to the high level and to the earth potential (GND), the PMOS transistor $Tr_B$ is turned off and the photodiode D starts the accumulation.

$T_3$ denotes a switching interval ($f_0 \rightarrow f_1$) of the row which is vertically scanned. The vertical scan to change over the rows is executed by a vertical shift register (not shown). A horizontal pixel train of the next row are selected by the control of pulses $\phi_{V1}$ and $\phi_{V2}$.

$T_4$ indicates a residual charge clearing interval of the accumulation capacitor $C_1$. When the pulses $\phi_{VC}$ and $\phi_{T1}$ are set to the high level, the MOS transistors $T_{VC}$ and $T_{T1}$ are turned on and the residual charges in the accumulation capacitor $C_1$ are cleared. After that, the pulse $\phi_{VC}$ is set to the low level and the MOS transistor $T_{VC}$ is turned off.

$T_5$ represents a reading interval of the sensor noises. By setting the pulse $\phi_{VR}$ to a positive potential ($+V$) and raising the base potential of the amplifying transistor $Tr_C$, the reading operation of the signal from the amplifying transistor $Tr_C$ is executed.

At this time, the base potential is a dark-state output potential. An output voltage depending on the characteristics of the amplifying transistor $Tr_C$ appears in the emitter. Such an output voltage is generally called an offset voltage. Since parameters of a plurality of amplifying transistors slightly differ, their emitter output voltages, that is, their offset voltages also differ. Differences among the offset potentials are now called sensor noises. The sensor noises are accumulated in the accumulation capacitor $C_1$.

$T_6$ denotes a residual charge clearing interval of the accumulation capacitor $C_2$. When the pulses $\phi_{VC}$ and $\phi_{T2}$ are set to the high level, the MOS transistors $T_{VC}$ and $T_{T2}$ are turned on and the residual charges in the accumulation capacitor $C_2$ are cleared. After that, by setting the pulse $\phi_{VC}$ to the low level, the MOS transistor $T_{VC}$ is turned off.

$T_7$ indicates an interval to transfer the photo charges of the photodiode D to the base of the amplifying transistor $Tr_C$. When the pulse $\phi_{TB}$ is set to the low level and to a negative potential ($-V$), the PMOS transistor $Tr_B$ is turned on, so that the photo charges accumulated in the photodiode D are transferred to the base of the amplifying transistor $Tr_C$.

$T_8$ represents a reading interval of a photo signal. When the pulse $\phi_{VR}$ is set to a positive potential ($+V$), the base potential of the amplifying transistor $Tr_C$ rises through the capacitor $C_{OX}$ and a photo signal output is read out of the amplifying transistor $Tr_C$. The foregoing sensor noises are included in the photo signal and are accumulated into the accumulation capacitor $C_2$.

Signals of columns of the accumulation capacitors $C_1$ in which the sensor noises are accumulated and signals of columns of the accumulation capacitors $C_2$ in which the photo signals are accumulated are transferred to horizontal output lines through horizontal transfer switches Th which are driven and selected by a horizontal shift register HSR. Since output terminals of the horizontal output lines are connected to a differential amplifier DA, the sensor noises are eventually subtracted from the photo signals and only the photo signals can be obtained.

The subtracting process of the sensor noises will now be described in detail hereinbelow.

According to the results of the experiments, the FPN after completion of the transient resetting differ due to differences of parameters such as $h_{FE}$ and the like of the amplifying transistors $Tr_C$ and a variation of $\Delta V$ occurs among base potentials $V_B$ after completion of the transient resetting. In the case of the emitter output, such a variation $\Delta V$ is increased by about $(1+Cb_e/C_B)$ times by the reading operation. $C_B$ denotes a synthesized capacity of a base-collector capacity $C_{bc}$, a base-emitter capacity $C_{be}$, and the capacity $Co_X$.

On the other hand, the random noise component corresponds to kTC noises upon resetting which depend on the synthesized capacity $C_B$ for the interval $T_1$, random noises upon execution of the reading operation of the sensor transistor, and random noises upon transfer of the photo charges of the photodiode D for the intervals $T_7$ and $T_8$. The kTC noises upon resetting slightly decrease by the transient resetting and are set to a value multiplied with about K ($=1/\sqrt{2}$). However, such kTC noises are eliminated by the above subtracting process.

On the other hand, the random noises upon transfer of the photo charges are band limited by a base input time constant and are so small to be ignored.

Further, although the random noises upon reading operating depend on the base capacity $C_B$, a load capacity $C_V$ and an accumulation capacity $C_T$ when they are seen from the emitter side, a current amplification factor $h_{FE}$, and the like, it has been found out that by setting the current amplification factor $h_{FE}$ to a large value to thereby increase a nondestructive degree, the random noises upon reading operation can be set to be extremely smaller than the random noises upon resetting. This means that with respect to the FPN and kTC noises of the sensor, the S/N ratio can be fairly improved by the subtracting process between the photo signal and the sensor noises. In the CCD, after the charge/voltage conversion output was amplified, the kTC noises due to the reset transistor are eliminated by a correlation double sampling method; however, the amplification noises are dominant because of the high-speed driving.

In the apparatus in which each pixel is constructed by an amplifying device as in the invention, the scanning is executed at a low speed by one horizontal scanning interval (1H), so that the amplification noises, that is, the readout noises are extremely small.

On the other hand, the dark current component of the amplifying transistor is also eliminated when the subtraction between the sensor noises and the photo signal is executed.

Figure 6:
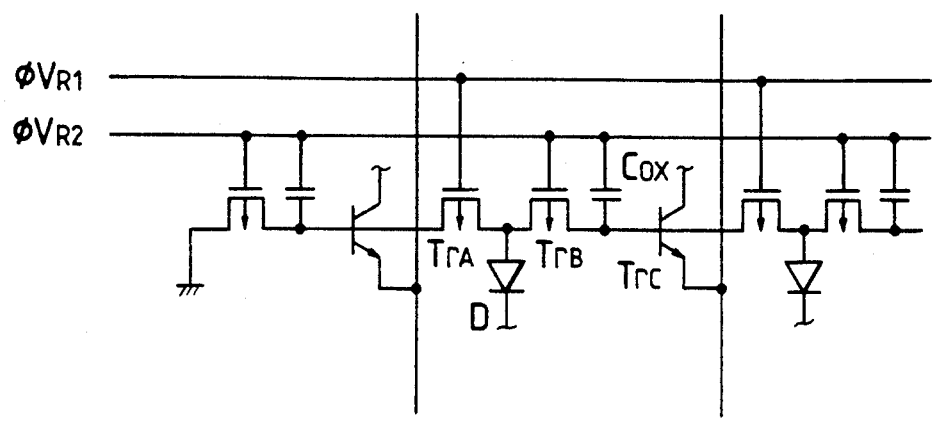
FIG. 6 is a partial circuit diagram of the second embodiment of a photoelectric converting apparatus of the invention.

FIG. 6 is a partial circuit diagram of the second embodiment of a photoelectric converting apparatus of the invention.

It is a feature of the second embodiment that the PMOS transistors $Tr_A$ and $Tr_B$ are serially connected and the photodiode D is arranged at a node of those transistors. Such an arrangement is preferably used in the case where the horizontal pixel size is larger than the vertical pixel size.

The pixels are reset by setting pulses $\phi_{VR1}$ and $\phi_{VR2}$ to a negative potential and turning on the PMOS transistors $Tr_A$ and $Tr_B$.

The transient resetting is executed in a manner such that the pulse $\phi_{VR2}$ is set to a positive potential to thereby turn off the PMOS transistor $Tr_B$, the potential of the base of the amplifying transistor $Tr_C$ is increased through the capacitor $Co_X$, and the emitter of the amplifying transistor $Tr_C$ is set to a predetermined potential.

The accumulation of the charges is executed in a manner such that the pulses $\phi_{VR1}$ and $\phi_{VR2}$ are set to the earth potential (GND) to thereby turn off the PMOS transistors $Tr_A$ and $Tr_B$ and the charges are accumulated into the photodiode D.

The sensor noises are read out in a manner such that after completion of the charge accumulation, the pulse $\phi_{VR2}$ is set to a positive potential to thereby turn off the PMOS transistor $Tr_B$, the base potential of the amplifying transistor $Tr_C$ is increased through the capacitor $Co_X$, and the sensor noises are read out of the emitter of the amplifying transistor $Tr_C$.

The photo signal is read out in the following manner. That is, the pulse $\phi_{VR2}$ is set to the earth potential (GND) to thereby turn off the PMOS transistor $Tr_B$. The pulse $\phi_{VR1}$ is set to a negative potential to thereby turn on the PMOS transistor $Tr_A$. The photo charges of the photodiode D are transferred to the base of the amplifying transistor $Tr_C$. The pulse $\phi_{VR1}$ is set to the earth potential (GND) to thereby turn off the PMOS transistor $Tr_A$. The pulse $\phi_{VR2}$ is set to a positive potential to thereby turn off the PMOS transistor $Tr_B$. The base potential of the amplifying MOS transistor $Tr_C$ is raised through the capacitor $Co_X$. The photo signal is read out of the emitter of the amplifying MOS transistor $Tr_C$.

Although the operating method of the second embodiment slightly differs from that of the first embodiment, the sensor noises can be eliminated in a manner similar to the first embodiment.

Figure 7:
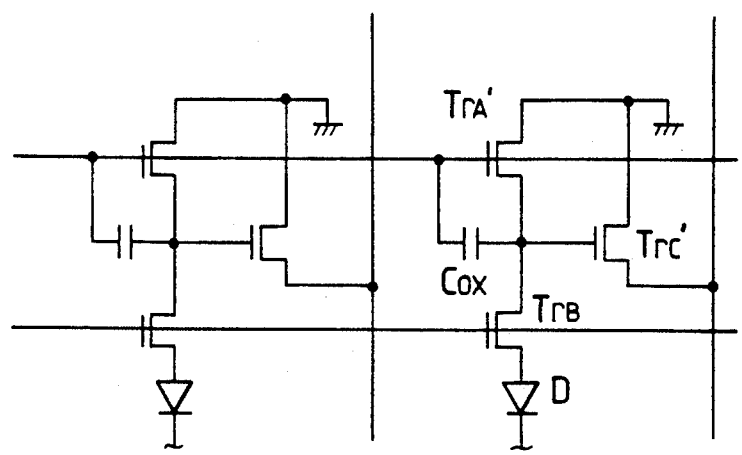
FIG. 7 is a partial circuit diagram of the third embodiment of a photoelectric converting apparatus of the invention.

FIG. 7 is a partial circuit diagram of the third embodiment of a photoelectric converting apparatus of the invention.

A feature of the third embodiment is that an MOS transistor is used as an amplifying device.

In the diagram, an MOS transistor $Tr_A'$ is a resetting MOS transistor to clear the residual charges in a gate region serving as a control electrode of an MOS transistor $Tr_C'$. In the first embodiment, the transient resetting has been executed since the amplifying device is constructed by a bipolar transistor. However, in the third embodiment, since the amplifying device comprises an MOS transistor, the transient resetting operation is unnecessary. The random noises included in photo charges accumulated in the photo diode D which are transferred to the gate and are read out from the MOS transistor, result in that the correlation between the sensor noises and the sensor noises included in the photo signal output is very high. Because the gate charges in a control electrode are not destroyed upon reading if an MOS transistor or an FET is used as an amplifying device of the sensor MOS transistor. Therefore, the sensor of a high S/N ratio can be eventually obtained.

Figure 8A:
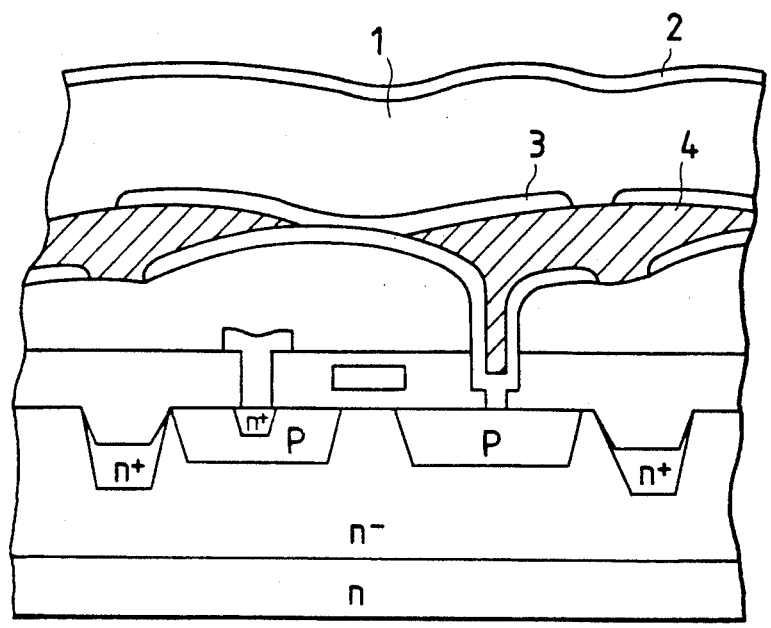
FIGS. 8A and 8B are cross sectional views of sensors in the fourth and fifth embodiments of the invention.
Figure 8B:
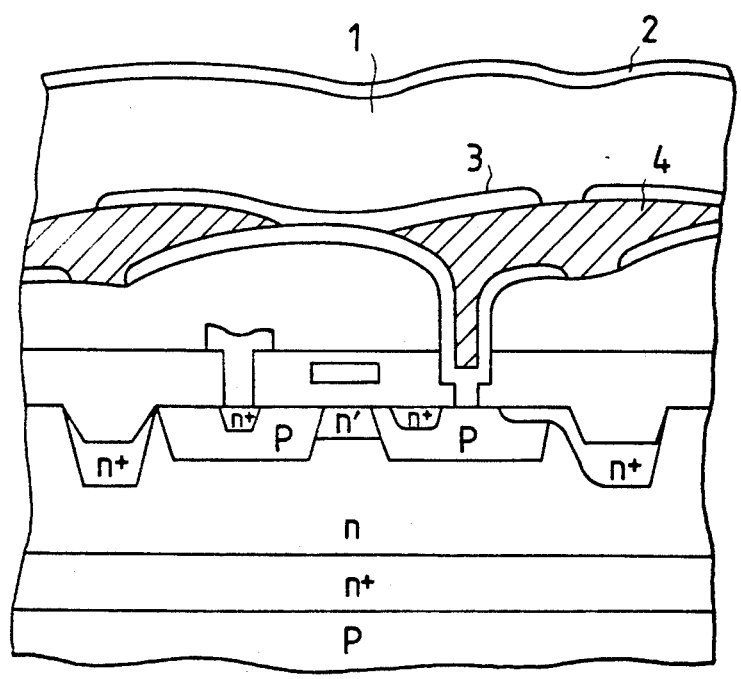

FIGS. 8A and 8B are cross sectional views of sensors in the fourth and fifth embodiments of the invention, respectively.

It is a feature of the 4th and 5th embodiments that a laminated photoconductive film is used in a photoelectric converting region.

As shown in the diagrams, a pixel electrode from a photoconductive film is connected to the photodiode unit in FIG. 4 in the first embodiment of the photoelectric converting apparatus.

In the diagram, reference numeral 1 denotes a photoconductive film; 2 indicates a transparent electrode; 3 a pixel electrode; and 4 an insulative layer. The film 1 is connected to a p type semiconductor region constructing the photodiode unit through the pixel electrode 3.

According to the 4th and 5th embodiments, since the photoconductive film can be also provided over the amplifying device unit, the numerical aperture can be increased and the S/N ratio can be raised.

Figure 9:
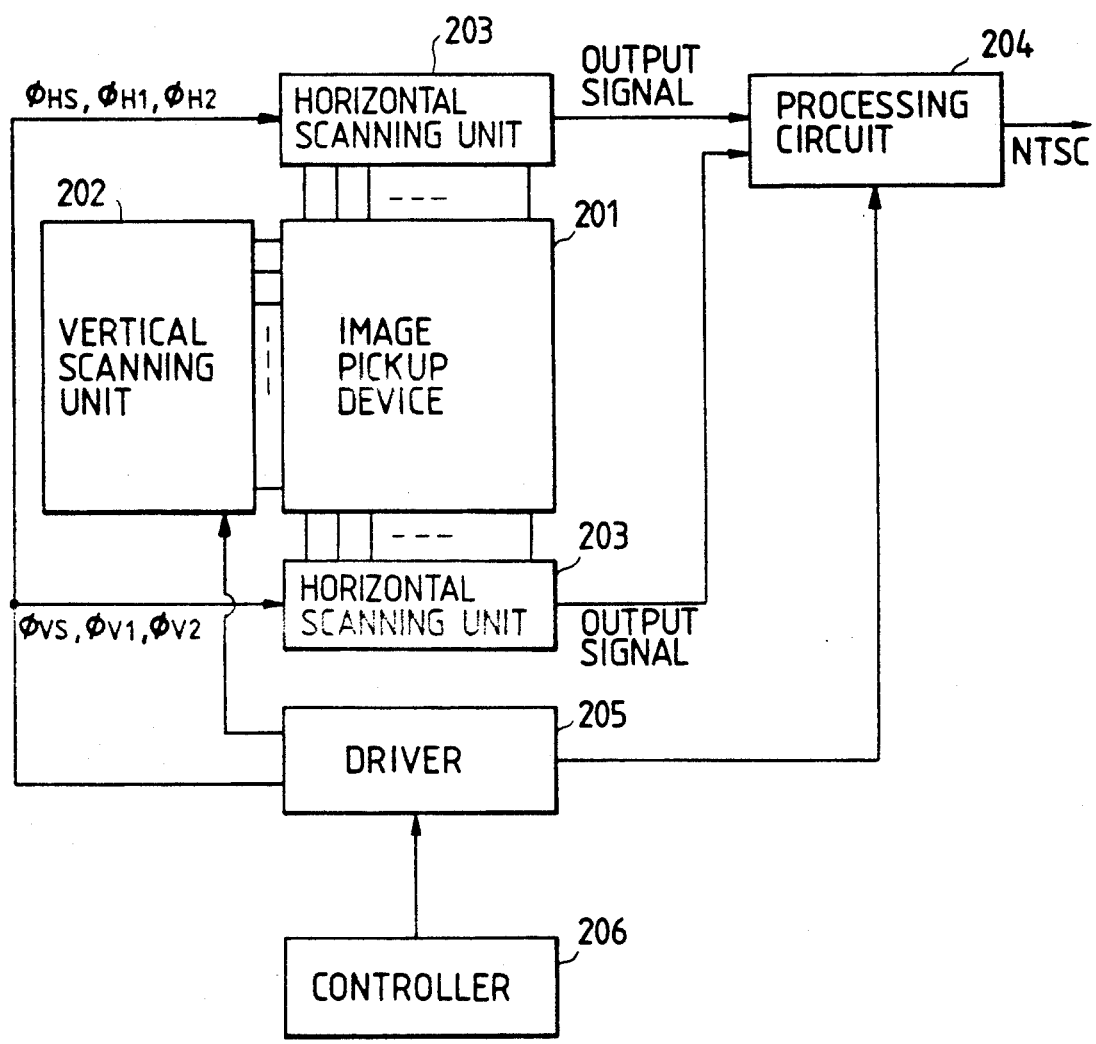
FIG. 9 is a schematic constructional diagram of a solid state image pickup device to which the invention is applied.

FIG. 9 is a schematic constructional diagram of a solid state image pickup device to which the invention is applied.

In the diagram, an image pickup device 201 in which photosensors are arranged like an area is television scanned by a vertical scanning unit 202 and a horizontal scanning unit 203.

A signal output from the horizontal scanning unit 203 is output as a standard television signal through a processing circuit 204.

Drive pulses $\phi_{HS}$, $\phi_{H1}$, $\phi_{H2}$, $\phi_{VS}$, $\phi_{V1}$, $\phi_{V2}$, etc. of the vertical and horizontal scanning units 202 and 203 are supplied by a driver 205. On the other hand, the driver 205 is controlled by a controller 206.

As described in detail above, according to the photoelectric converting apparatus of each of the embodiments, of the invention, by providing the switching means between the accumulating means for accumulating the light excited charges and the amplifying means for amplifying the charges of the control electrode, the sensor noises of the amplifying device can be independently read out irrespective of the operation of the accumulating means. Not only the FPN but also the dark current component and random noises of the amplifying device can be eliminated. On the other hand, the amplifying device can be driven at a low speed. The noises upon reading can be fairly reduced. Thus, an image pickup device of a high S/N ratio can be realized.

If the accumulating region serving as accumulating means and the amplifying region serving as amplifying means are formed onto the substrate and the photoelectric converting region is laminated onto the amplifying region and the photoelectric converting region and the amplifying region are connected, the numerical aperture can be increased and the S/N ratio can be raised.

Figure 10:
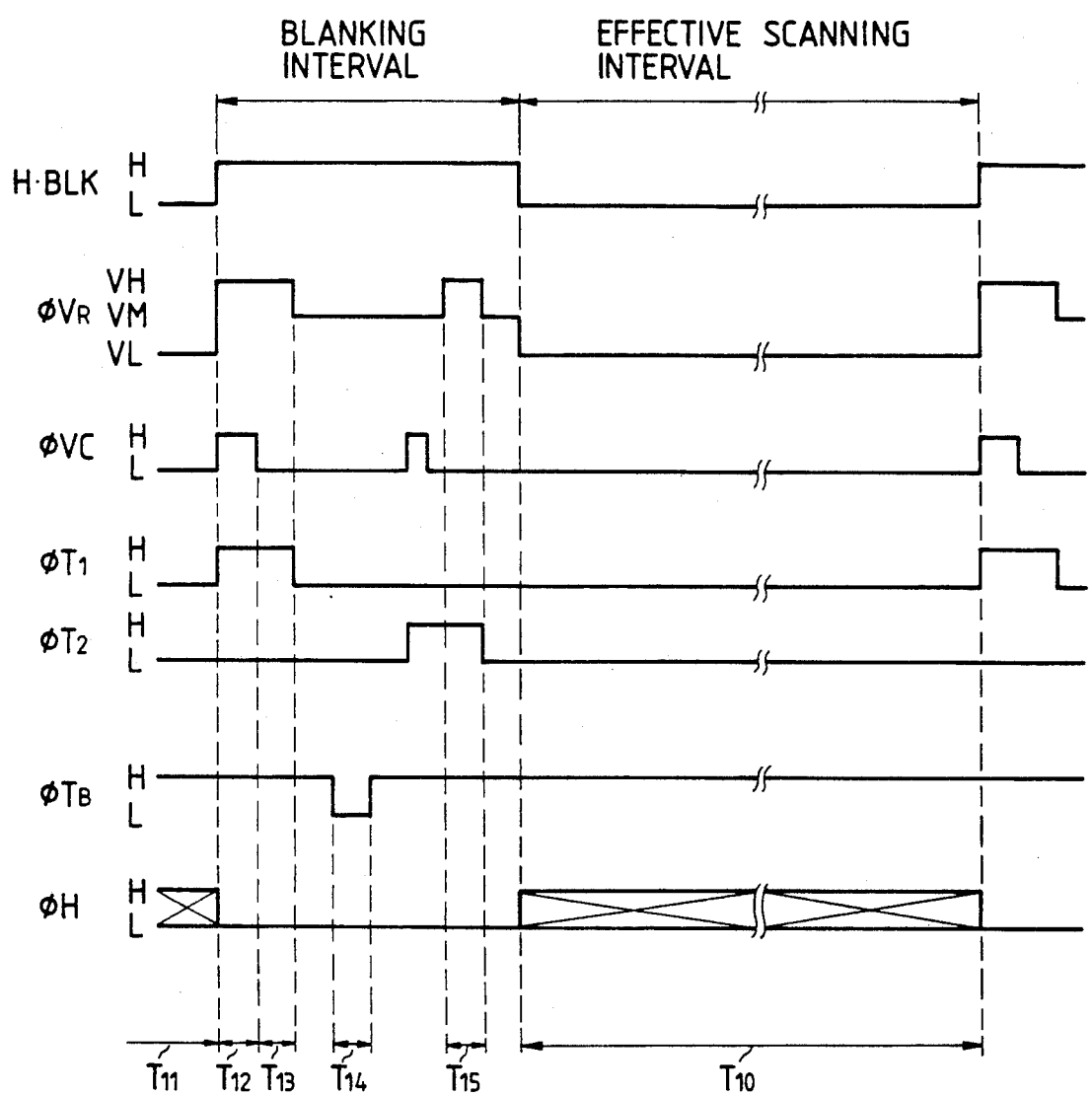
FIG. 10 is a timing chart for a photoelectric converting apparatus of the sixth embodiment of the invention.

FIG. 10 is a timing chart for the sixth embodiment of the invention.

In FIG. 10, $T_{11}$ denotes a complete resetting interval of the amplifying transistor $Tr_C$ in the horizontal direction. $T_{11}$ also indicates an output interval of signals from the accumulation capacitors $C_1$ and $C_2$, which will be explained hereinlater, and sensor noises. The complete resetting is performed by setting the pulse $\phi_{VR}$ to a negative potential ($V_L$ shown in the diagram) and turning on the PMOS transistor $Tr_A$.

The base potential is clamped to the GND by the complete resetting. Due to this, the dark current component of the amplifying transistor can be eliminated.

For an interval $T_{12}$, the transient resetting is executed subsequently to the complete resetting at the interval $T_{11}$. By setting the pulse $\phi_{VR}$ to a positive potential ($V_H$ shown in the diagram), the PMOS transistor $Tr_A$ is turned off. The base potential of the amplifying transistor $Tr_C$ increases through the capacitor $Co_X$. At the same time, by setting the pulse $\phi_{VC}$ to the high level, the MOS transistor $T_{VC}$ is turned on, thereby setting the emitter of the amplifying transistor $Tr_C$ to a predetermined potential $V_{VC}$. At this time, a quantity of base charges of the amplifying transistor $Tr_C$ rapidly decreases due to the recombination with the emitter current. On the other hand, by setting the pulse $\phi_{T1}$ to the high level, the MOS transistor $T_1$ is turned on and the accumulation capacitor $C_1$ is set to a predetermined reset potential $V_{VC}$.

$T_{13}$ denotes a reading interval of the sensor noises. The pulse $\phi_{VR}$ is held to the positive potential $V_H$. In this state, by setting the pulse $\phi_{VC}$ to the low level, the MOS transistor $T_{VC}$ is turned off and the emitter of the amplifying transistor $Tr_C$ is set into the floating state. Thus, the voltage of the emitter terminal is set to a potential to which the base voltage is reflected.

The base potential at this time corresponds to the dark-state output potential. An offset voltage depending on the characteristics of the amplifying transistor $Tr_C$ appears at the emitter. In the specification, the differences among the offset potentials of the amplifying transistors are called sensor noises. The sensor noises are accumulated into the accumulation capacitor $C_1$.

After the sensor noises were read out, the pulse $\phi_{VR}$ changes from the high voltage $V_H$ to an intermediate voltage $V_M$. The base of the amplifying transistor $Tr_C$ is reversely biased through the capacitor $Co_X$ by such a potential change.

$T_{14}$ denotes an interval to transfer the photo charges of the photodiode D to the base of the amplifying transistor $Tr_C$. By setting the pulse $\phi_{TB}$ to a low voltage and to a negative potential ($V_L$), the transfer device $Tr_B$ is turned on and the photo charges accumulated in the photodiode D are transferred to the base of the amplifying transistor $Tr_C$.

Since the base potential of the amplifying transistor $Tr_C$ is set to be lower than the potential of the photodiode D, the photo charges are completely transferred from the photodiode D to the amplifying transistor $Tr_C$.

After the interval $T_{14}$, by setting the pulse $\phi_{VC}$ to the high level, the MOS transistor $T_{VC}$ is turned on. By setting the pulse $\phi_{T2}$ to the high level, the MOS transistor $T_2$ is turned on. Thus, the accumulation capacity $C_2$ is set to a predetermined reset potential $V_{VC}$.

$T_{15}$ indicates a reading interval of the photo signal. When the pulse $\phi_{VR}$ is set to a positive potential ($V_H$), the base potential of the amplifying transistor $Tr_C$ rises through the capacitor $Co_X$ and the photo signal output is read out of the amplifying transistor $Tr_C$. The above sensor noises are included in the photo signal and accumulated into the accumulation capacity $C_2$.

Signals of columns of the accumulation capacitors $C_1$ in which the sensor noises are accumulated and signals of columns of the accumulation capacitors $C_2$ in which the photo signals are accumulated are transferred to horizontal output lines through horizontal transfer switches Th which are driven and selected by the horizontal shift register HSR. Since output terminals of the horizontal output lines are connected to the differential amplifier DA, the sensor noises are eventually subtracted from the photo signals and only the photo signals can be obtained in a manner similar to the cases of the first to fifth embodiments.

At the timing in the embodiment shown in FIG. 10, the transient resetting is executed at the interval $T_{12}$. However, the transient resetting is not an inevitable condition. For instance, in the case where a bipolar transistor is used as an amplifying transistor, the transient resetting can be executed. However, in the case of an MOS transistor, the transient resetting cannot be performed.

As mentioned above, according to the sixth embodiment of the invention, the resetting means for resetting the control electrode of the amplifying means before the charges in the accumulating means are transferred to the amplifying means is provided and, after the control electrode was reset, the output of the amplifying means is read out as a first signal, while after the transfer device was made conductive and the charges in the accumulating means were transferred to the control electrode, the output of the amplifying means is read out as a second signal. Thus, the dark current component of the amplifying means can be eliminated before the photo charges are transferred. The potential of the control electrode of the amplifying means is set to be lower than the accumulation potential of the accumulating means. The photo charges can be completely transferred from the accumulating means to the amplifying means.

The seventh embodiment of the invention will now be described in detail with reference to the drawings.

Figure 11:
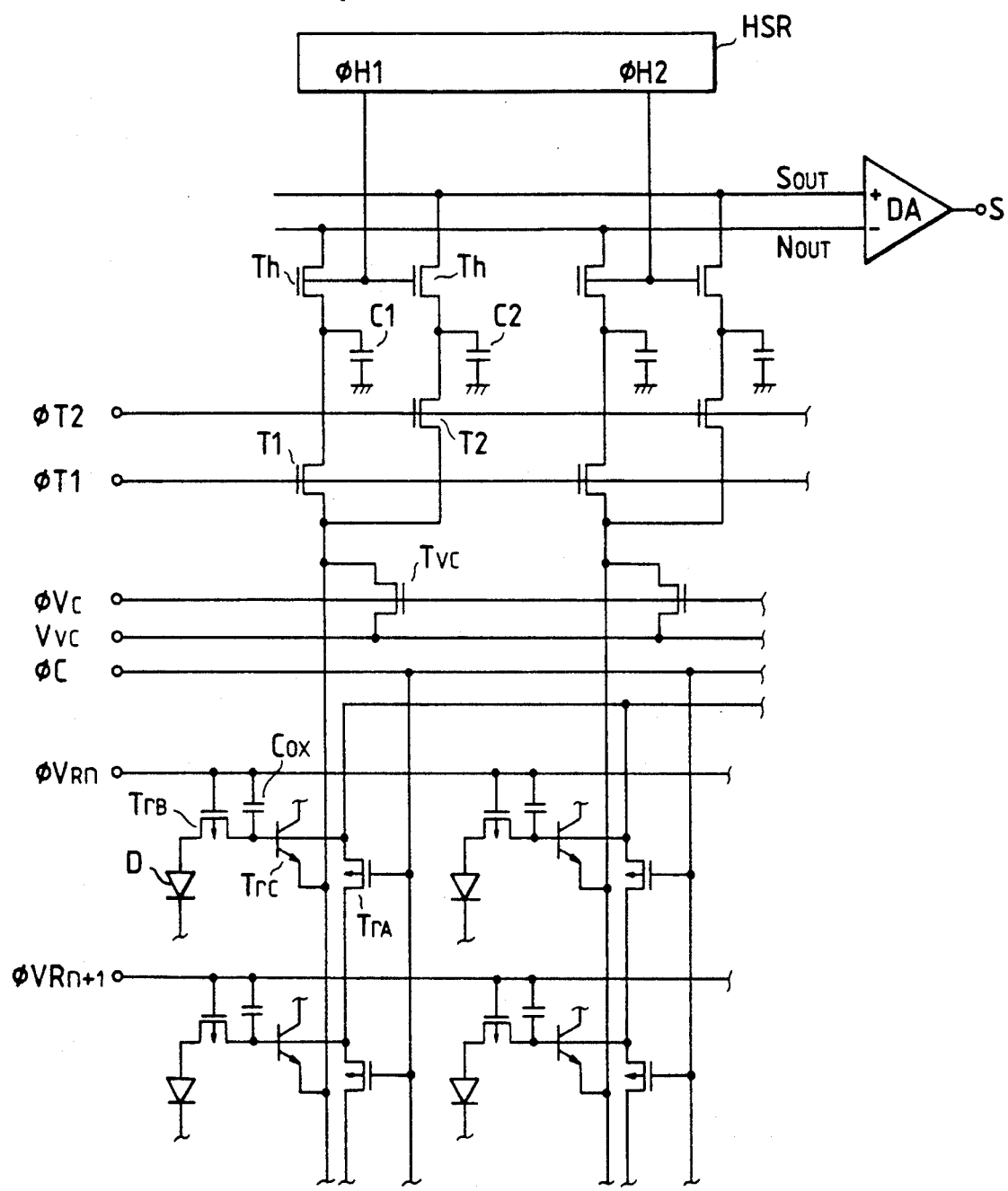
FIG. 11 is a partial circuit diagram of the seventh embodiment of a photoelectric converting apparatus of the invention.

FIG. 11 is a partial circuit diagram of the seventh embodiment of a photoelectric converting apparatus of the invention.

Figure 12:
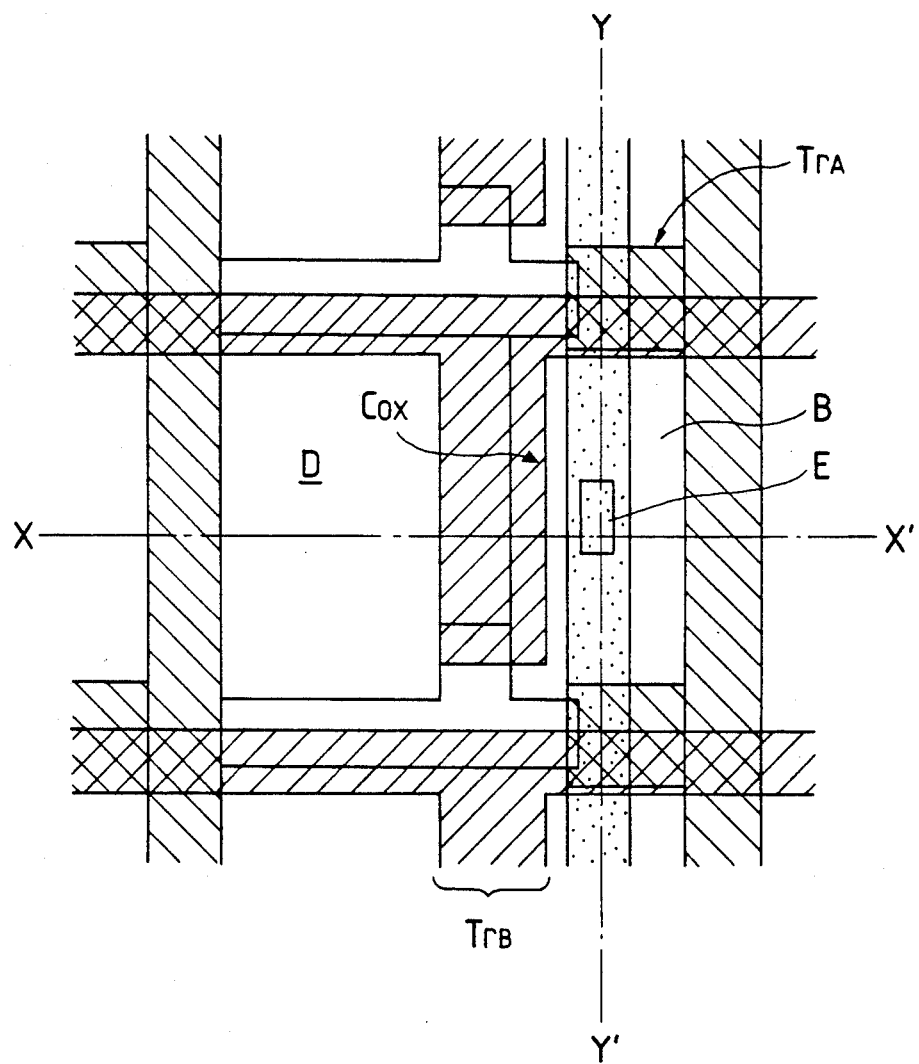
FIG. 12 is a schematic plan view of pixels of the photoelectric converting apparatus of FIG. 11.

FIG. 12 is a schematic plan view of pixels of the photoelectric converting apparatus of FIG. 11.

Figure 13:
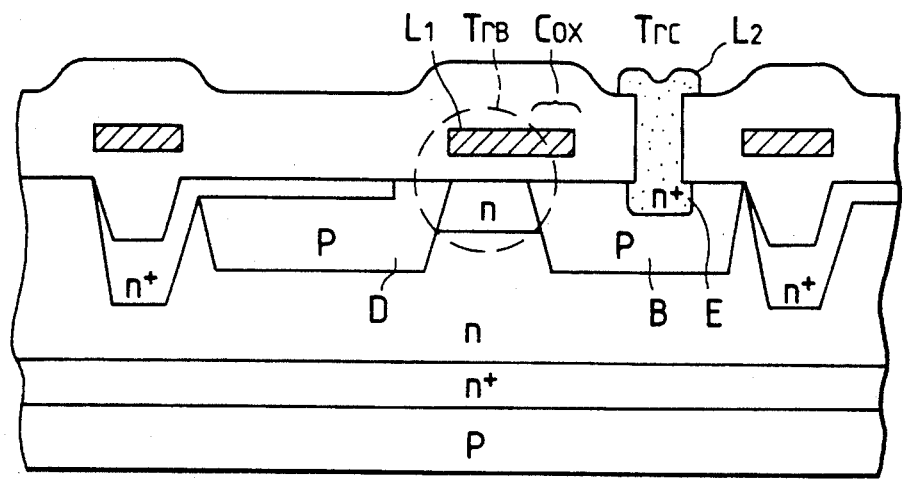
FIG. 13 is a cross sectional view taken along the line X—X' of the photoelectric converting apparatus of FIG. 12.

FIG. 13 is a cross sectional view taken along the like X—X' of the photoelectric converting apparatus of FIG. 12.

Figure 14:
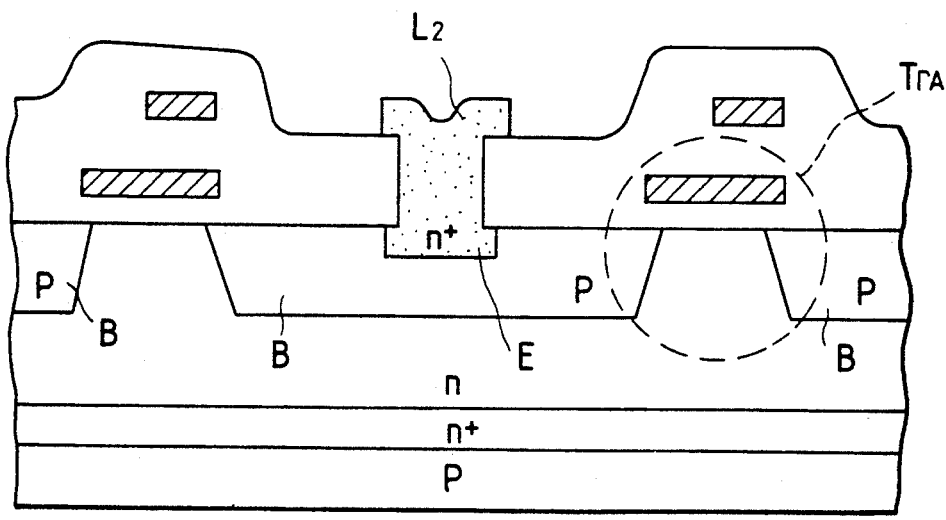
FIG. 14 is a cross sectional view taken along the line Y—Y' of the photoelectric converting apparatus of FIG. 12.

FIG. 14 is a cross sectional view taken along the line Y—Y' of the photoelectric converting apparatus of FIG. 12.

Although photoelectric converting units of the photoelectric converting apparatus of the seventh embodiment are arranged like a matrix, only four pixels are shown for simplicity of drawing in FIG. 11.

As shown in FIG. 11, one pixel comprises: the PMOS transistor $Tr_A$ to reset the pixel; the capacitor $Co_X$ to control the transient resetting of the pixel and the accumulating and reading operations of the signal; the photodiode D serving as accumulating means for accumulating the light excited charges; the amplifying transistor $Tr_C$ to amplify the signal from the photodiode D; and the transfer device $Tr_B$ to transfer the charges generated in the photoelectric converting unit of the photodiode D to the base serving as a control electrode of the amplifying transistor $Tr_C$. The gates of the PMOS transistors $Tr_B$ of the pixels arranged in the main scanning direction and one of the terminals of each of the capacitors $Co_X$ are commonly connected. All of the gates of the PMOS transistors $Tr_A$ of the pixels arranged in the main scanning direction and the sub-scanning direction are commonly connected. $\phi_C$ and $\phi_{VR(n)}$ denote pulses to control the PMOS transistor $Tr_A$ and the transfer device $Tr_B$, respectively.

The emitter of the amplifying transistor $Tr_C$ is connected to the accumulation capacitors $C_1$ and $C_2$ through the MOS transistors $T_1$ and $T_2$. The sensor noises and signals are respectively accumulated into the accumulation capacitors $C_1$ and $C_2$ and are output as a sensor noise output ($S_{out}$) and a signal output ($N_{out}$) by the control of the pulses $\phi_{H1}$ and $\phi_{H2}$ from the horizontal shift register HSR. $\phi_{T1}$ and $\phi_{T2}$ denote the pulses to control the MOS transistors T1 and T2, respectively. $T_{VC}$ indicates an MOS transistor to reset vertical signal lines. The MOS transistor $T_{VC}$ is set to the potential $V_{VC}$ by the control of the pulse $\phi_{VC}$.

As shown in FIGS. 12 and 14, the bases B serving as control electrodes of the pixels are isolated in the sub-scanning direction by the PMOS transistor $Tr_A$ (shown by a broken line in FIG. 14). When the PMOS transistor $Tr_A$ is turned on, the base B of each pixel is reset. Although each pixel is formed over a p type substrate as shown in FIGS. 13 and 14, it can be also formed over an n type substrate.

On the other hand, as shown in FIG. 13, the capacitor $Co_X$ is formed in a part of the base B of the amplifying transistor $Tr_C$ by the poly layer $L_1$ provided over the $SiO_2$ layer. The emitter E is wired and connected as a vertical output line by the Al layer $L_2$. As shown in FIG. 12, the photodiode D serving as a photoelectric converting unit and the base B of the amplifying transistor $Tr_C$ are isolated by the transfer device comprising the PMOS transistor $Tr_B$ (shown by a broken line in FIG. 13). When the PMOS transistor $Tr_B$ is turned on, the charges accumulated in the photodiode D are transferred to the base B of the amplifying transistor $Tr_C$. Although the portions other than the photodiode D are generally light shielded, they are omitted in FIGS. 12 to 14.

The operation of the photoelectric converting apparatus will now be described hereinbelow with reference to FIGS. 11 to 14.

FIG. 15 is a timing chart for explaining the operation of the photoelectric converting apparatus.

In FIG. 15, $T_{21}$ denotes a resetting interval of a pixel train in the sub-scanning direction. By setting the pulse $\phi_C$ to a negative potential ($-V$), the PMOS transistor $Tr_A$ is turned on, and the control electrode (base) of the amplifying transistor $Tr_C$ is reset before the sensor noises and the signal are read out.

$T_{22}$ indicates a transient resetting interval of a pixel train in the sub-scanning direction. When the pulse $\phi_{VR}$ is set to a positive potential ($+V$), the base potential of the amplifying transistor $Tr_C$ rises through the capacitor $Co_X$. At the same time, by setting the pulse $\phi_{VC}$ to the high level, the MOS transistor $T_{VC}$ is turned on and the emitter of the amplifying transistor $Tr_C$ is set to a predetermined potential $V_{VC}$. At this time, the base potential of the amplifying transistor $Tr_C$ rapidly decreases by the recombination of the charges at the base and the emitter current (such a phenomenon is called a transient reset). By also setting the pulse $\phi_{T1}$ to the high level, the MOS transistor $T_1$ is turned on and the potential of the accumulation capacitor $C_1$ is set to the potential $V_{VC}$.

For an interval $T_{23}$, by setting the pulse $\phi_{VC}$ to the low level, the MOS transistor $T_{VC}$ is turned off, the emitter of the amplifying transistor $Tr_C$ is set into a floating state, and the sensor noises are read out.

The base potential at this time corresponds to the dark-state output potential and the output voltage depending on the characteristics of the amplifying transistor $Tr_C$ appears at the emitter. Such an output voltage is generally called an offset voltage. Since parameters of a plurality of amplifying transistors slightly differ, the emitter output voltages, that is, the offset voltages also differ. The differences of the offset potentials are called sensor noises. The sensor noises are accumulated into the accumulation capacitor $C_1$. After the interval $T_{23}$, the pulse $\phi_{VC}$ is set to the high level and the MOS transistor $T_{VC}$ is turned on. At the same time, by setting the pulse $\phi_{T1}$ to the high level, the MOS transistor $T_2$ is turned on and the potential of the accumulation capacitor $C_2$ is set to the potential $V_{VC}$.

$T_{24}$ denotes an interval to transfer the photo charges in the photodiode D to the base of the amplifying transistor $Tr_C$. When the pulse $\phi_{VR(n)}$ is set to a low level and to a negative potential ($-V$), the PMOS transistor $Tr_B$ is turned on. The photo charges accumulated in the photodiode D are transferred to the base of the amplifying transistor $Tr_C$.

$T_{25}$ indicates a reading interval of the photo potential (+V), the base potential of the amplifying transistor $Tr_C$ rises through the capacitor $C_{OX}$ and the photo signal output is read out of the amplifying transistor $Tr_C$. The sensor noises are included in the photo signal. The sensor noises are accumulated into the accumulation capacitor $C_2$.

The horizontal transfer switches Th are controlled to be turned on and off by the pulses $\phi_{H1}$ and $\phi_{H2}$ which are output from the horizontal shift register HSR and the signals of columns of the accumulation capacitors $C_1$ in which the sensor noises are accumulated and the signals of columns of the accumulation capacitors $C_2$ in which the photo signals are accumulated are output as a sensor noise output ($S_{out}$) and a signal output ($N_{out}$) to the horizontal output lines (interval $T_{26}$) under control of the horizontal transfer switches. Since the output terminals of the horizontal output lines are connected to a differential amplifier, the sensor noises are eventually subtracted from the photo signal and only the photo signal can be obtained.

According to the seventh embodiment of the invention, by providing the resetting means between the control electrodes of the pixels which are adjacent in the sub-scanning direction and by resetting the control electrodes by the resetting means, the pixels arranged in the sub-scanning direction can be reset simultaneously with the resetting of the pixels arranged in the main scanning direction and the smear can be reduced.

I claim:

1. A photoelectric converting apparatus comprising:
   accumulating means for accumulating charges generated by light excitation;
   amplifying means for amplifying charges of a control electrode;
   switching means for connecting the accumulating means and the control electrode;
   first reading means for reading out an output of the amplifying means as a first signal when the switching means is not conductive;
   transferring means for making the switching means conductive and for transferring the charges in the accumulating means to the control electrode;
   second reading means for reading out the output of the amplifying means as a second signal after the charges were transferred; and
   subtracting processing means for executing a subtracting process of the first and second signals.

2. An apparatus according to claim 1, wherein an accumulating region serving as the accumulating means and an amplifying region serving as the amplifying means are formed onto a substrate, a photoelectric converting region is laminated onto the amplifying region, and the photoelectric converting region and the amplifying region are electrically connected.

3. An apparatus according to claim 1, wherein the accumulating means is a photodiode.

4. An apparatus according to claim 1, wherein the amplifying means is a transistor.

5. An apparatus according to claim 1, wherein the first and second reading means including memory means.

6. An apparatus according to claim 5, wherein the memory means includes a capacitor.

7. A photoelectric converting apparatus comprising:
   accumulating means for accumulating charges generated by light excitation;
   amplifying means for amplifying charges of a control electrode;
   connecting means for connecting said accumulating means and said control electrode;
   resetting means which has a transfer device to connect the accumulating means and the control electrode and resets the control electrode before the charges in the accumulating means are transferred to the amplifying means;
   first reading means for reading out an output of the amplifying means as a first signal after the control electrode was reset;
   transferring means for making the transfer device conductive and for transferring the charges in the accumulating means to the control electrode;
   second reading means for reading out the output of the amplifying means as a second signal after the charges were transferred; and
   subtracting processing means for executing a subtracting process of the first and second signals.

8. An apparatus according to claim 7, wherein an accumulating region serving as the accumulating means and an amplifying region serving as the amplifying means are formed onto a substrate, a photoelectric converting region is laminated onto the amplifying region, and the photoelectric converting region and the amplifying region are electrically connected.

9. An apparatus according to claim 7, wherein the accumulating means is a photodiode.

10. An apparatus according to claim 7, wherein the amplifying means is a transistor.

11. An apparatus according to claim 7, wherein the first and second reading means include memory means.

12. An apparatus according to claim 11, wherein the memory means includes a capacitor.

13. A photoelectric converting apparatus having a plurality of pixels in each of which accumulating means for accumulating light excited charges, amplifying means for amplifying charges of a control electrode, and a transfer device to connect the accumulating means and the control electrode are used as component elements, wherein said apparatus comprises:
   resetting means which is provided between the control electrodes of the pixels which are adjacent in a sub-scanning direction;
   first reading means for resetting the control electrodes by the resetting means and for reading out an output of the amplifying means as a first signal;
   transferring means for making the transfer device conductive and for transferring the charges in the accumulating means to the control electrode;
   second reading means for reading out the output of the amplifying means as a second signal after the charges were transferred; and
   subtracting processing means for executing a subtracting process of the first and second signals.

14. An apparatus according to claim 13, wherein the accumulating means is a photodiode.

15. An apparatus according to claim 13, wherein the amplifying means is a transistor.

16. An apparatus according to claim 13, wherein the first and second reading means include memory means.

17. An apparatus according to claim 16, wherein the memory means includes a capacitor.

* * * * *

UNITED STATES PATENT AND TRADEMARK OFFICE
CERTIFICATE OF CORRECTION

PATENT NO. : 5,172,249

DATED : December 15, 1992

INVENTOR(S) : SEIJI HASHIMOTO

It is certified that error appears in the above-identified patent and that said Letters Patent is hereby corrected as shown below: Title page, item [56] REFERENCES CITED Under U.S. PATENT DOCUMENTS, insert:

--4,336,557  6/1982   Koch ................ 358/213
  4,437,112  3/1984   Tanaka et al. ....... 358/44
  4,922,138  5/1990   Hashimoto et al. .... 307/482
  4,876,601  10/1989  Hashimoto et al. .... 358/213.26
  4,914,319  4/1990   Hashimoto ........... 307/353
  4,910,597  3/1990   Harada et al. ....... 358/213.15
  4,910,599  3/1990   Hashimoto ........... 358/213.26
  4,959,723  9/1990   Hashimoto ........... 358/213.11
  4,958,085  9/1990   Hashimoto et al. .... 307/262
  4,967,067  10/1990  Hashimoto et al. .... 250/208.1
  4,962,412  10/1990  Shinohara et al. .... 357/30 --.

After U.S. PATENT DOCUMENTS, item [56], insert
          under
  --      FOREIGN PATENT DOCUMENTS 260954  3/1988  European Pat. Off. .
  232593  8/1987  European Pat. Off. .
   25168  3/1981  European Pat. Off. .
  302675  2/1989  European Pat. Off. . --.

COLUMN 5

Line 31, "$SiO_2$" should read --$SiO_2$--.
Line 67, "pulse $T_{vc}$" should read --pulse $\phi_{vc}$--.

COLUMN 12

Line 7, "$SiO_2$" should read --$SiO_2$--.

UNITED STATES PATENT AND TRADEMARK OFFICE
CERTIFICATE OF CORRECTION

PATENT NO. : 5,172,249
DATED : December 15, 1992
INVENTOR(S) : SEIJI HASHIMOTO

It is certified that error appears in the above-identified patent and that said Letters Patent is hereby corrected as shown below:

COLUMN 13

Line 3, "photo potential" should read --photo signal.
When the pulse $\phi_{VR}$ is set to a positive potential--.
Line 63, "including" should read --include--.

Signed and Sealed this

Thirtieth Day of November, 1993

Attest:

BRUCE LEHMAN

Attesting Officer

Commissioner of Patents and Trademarks